United States Patent
Tamm

[19]

[11] Patent Number: 6,035,527

[45] Date of Patent: Mar. 14, 2000

[54] METHOD FOR THE PRODUCTION OF PRINTED CIRCUIT BOARDS

[75] Inventor: Wilhelm Tamm, Aidlingen, Germany

[73] Assignee: Ingenieurbuero Tamm Factory Innovations, Deufringen, Germany

[21] Appl. No.: 08/854,468

[22] Filed: May 12, 1997

[30] Foreign Application Priority Data

May 18, 1996 [DE] Germany .......................... 196 20 095

[51] Int. Cl.⁷ ...................................... H01K 3/10
[52] U.S. Cl. .................. 29/852; 29/846; 427/97
[58] Field of Search .......... 29/852, 846; 427/97

[56] References Cited

U.S. PATENT DOCUMENTS

| | | | |
|---|---|---|---|
| 3,042,591 | 7/1962 | Cado | 204/15 |
| 4,532,152 | 7/1985 | Elarde | 427/96 |
| 4,604,799 | 8/1986 | Gurol | 29/852 X |
| 4,712,297 | 12/1987 | Wolfram | 29/852 |
| 4,870,751 | 10/1989 | Antoon | 29/846 |
| 4,882,200 | 11/1989 | Yung | 427/53 |
| 4,996,391 | 2/1991 | Schmidt | 29/852 X |
| 5,168,624 | 12/1992 | Shirai | 29/852 X |

FOREIGN PATENT DOCUMENTS

| | | |
|---|---|---|
| 0164564 | 12/1985 | European Pat. Off. . |
| 0287843 | 10/1988 | European Pat. Off. . |
| 0677985 | 10/1995 | European Pat. Off. . |
| 4007558 | 9/1990 | Germany . |
| 4417245 | 10/1995 | Germany . |

OTHER PUBLICATIONS

"Excimer Laser Deposition and Patterning of Metal Organic Inks" in : IBM TDB, vol. 34, No. 4B, Sep. 1991, pp. 352–353.

"Anwendung der Laseraktivierung und Lasermetallisierung in der Mikroelektronik" in: Galvanotechnick 81 (1990), No. 10, pp. 3495–3499.

*Primary Examiner*—Carl J. Arbes
*Attorney, Agent, or Firm*—Paul Vincent

[57] ABSTRACT

A method for the production of printed circuit boards comprises the steps of producing recesses (2, 3, 4, 5) and/or through holes (2a) in a substrate (1) made from insulating material, in particular by means of laser-ablation, wherein the recesses and/or through holes correspond to the desired structure of conductive tracks and/or plated through holes; introducing a base layer (6) on one or both sides of the substrate (1); and introducing a conductive material (7) onto the base layer (6) which is catalytic and/or activating relative to the conductive material (7). The base layer (6) is selectively removed from the substrate (1), except in the recesses and/or in the through holes, by means of laser-ablation prior to introduction of the conductive material (7). Processing of the surface of the conductive material, the base layer or of the substrate is no longer necessary.

13 Claims, 7 Drawing Sheets

METHOD FOR THE PRODUCTION OF PRINTED CIRCUIT BOARDS

BACKGROUND OF THE INVENTION

The invention concerns a method for the production of printed circuit boards including the following steps;

Production of recesses and/or through holes in a substrate made from insulating material, in particular by means of laser-ablation, wherein the recesses and/or through holes correspond to the desired structure of conductive tracks and/or through hole platings.

introduction of a base layer on one or both sides of the substrate; and introduction of a conductive material onto the base layer, the base layer being catalytic and/or activating with respect to the conducting material.

A manufacturing procedure of this type is e.g. known in the art through EP 0 677 985 A1.

When producing printed circuits or printed circuit boards, one distinguishes in principal between the widely used subtractive method which starts with metal-clad substrates or base materials and with which copper not needed for conducting leads is removed by means of etching, and the additive method which builds up the conducting material on bonding substrate layers in such a manner that following removal from the baths, the conducting material is only located where conducting leads are needed.

Combinations of these methods are also wide spread. In this manner the through hole contacting, i.e. by copper coating of the walls of the holes, additively processes conducting leads located on both sides and produced in a subtractive fashion. A semi-additive method uses galvanic amplification to build up the conducting leads on thin base layers produced by currentless deposition and the remaining base layers are removed through etching, i.e. subtractively. In order to produce through holes and bottom holes, mechanical boring is normally utilized in combination with direct metallization.

Known in the art through the German magazine publication "Galvanotechnik" [Galvanometric Technology] 77, (1986), No. 1, pages 51 through 60, is the use of a laser to assist the transfer of the conductive pattern during production of printed circuit boards using the fully additive method.

In addition EP A 0 164 564 discloses the possibility of producing bottom holes in a substrate using an excimer laser. This process of material removal is designated laser-ablation.

EP 0 677 985 A1 describes the production of recesses and through holes in substrates by means of ablation with the assistance of an excimer laser. Energy calculations allow for the production of a defined depth profile. A layer of electrically conducting material is subsequently introduced onto the surface of the substrate, e.g. using a PVD procedure. An additional metal layer is deposited on this base layer and the metal layer and the base layer are removed by grinding or polishing from the outer side of the substrate, in such a fashion that conductive material only remains in the recesses and/or through holes.

In this conventional method, the base layer is completely coated with a metal layer, e.g. a copper layer which must then be nearly completely removed by grinding, polishing, lapping or the like. This mechanical removal of the superfluous material causes high mechanical loading of the foil-like substrate. In addition a flat mechanical removal in a tolerance range on the order of magnitude of 1 μm, requires very expensive installations.

EP 0 287 843 B1 discloses preferential use of a pulsed excimer laser for ablation of the base layer. Also disclosed in EP 0 287 843 B1 is the possibility of producing a negative image of the conductive leads with ablation by means of electromagnetic radiation, wherein the base layer is selectively removed without encroaching substantially on the surface of the substrate. Metallization cannot occur during subsequent processing steps in the regions at which the electromagnetic radiation has acted. In this manner, the advantages of the additive method are maintained in a particularly simple method of conductive pattern transfer using electromagnetic radiation.

This method known in the art from EP 0 287 843 B1 has the disadvantage that formation of the conductive tracks takes place on the surface of the substrate. This means that the combination of a plurality of layers results in a surface topography which causes problems when inserting the components into the printed circuit board.

It is therefore the purpose of the present invention to create a method for the production of printed circuit boards using the additive method which produces high quality technical results in an economical manner without harming the environment.

This purpose is achieved in accordance with one aspect of the invention in that that the base layer is selectively removed from the substrate except in the recesses and/or in the through holes prior to introduction of the conductive material.

SUMMARY OF THE INVENTION

This additive manufacturing method has the substantial advantage that the structure of the desired conductive tracks can be mechanically determined e.g. using laser-ablation, with the introduction of the conductive material transpiring selectively on the substrate base layer. The rate of deposition of the conductive material, e.g. copper can be easily controlled so that a flat surface can be maintained between the introduced conductive material and the base layer or the substrate respectively. Processing of the surface of the conductive material, of the base layer or of the substrate is no longer necessary.

The manufacturing procedure in accordance with the invention additionally facilitates the introduction of the conductive tracks in recesses in the substrate. In this fashion a simple transfer of extremely fine and precise conductive structures can be guaranteed with good binding and without causing problems in the production of through plated holes.

The manufacturing process in accordance with the invention, has the following additional advantages:

high density, high precision of the pattern formation extremely high resolution, excellent reproducibility with a resolution corresponding to that of the finest of conducting geometries of thin film technology excellent surface flatness since the conducting leads are engraved into the base material allows for the use of high temperature resistant base materials (e.g. having $T_g$-values >500° C.)

extremely short processing cycle (3 through 6 processing steps/layer), with high potential for cost reduction.

In a particularly preferred embodiment of the manufacturing process in accordance with the invention, the base layer is removed by means of laser-ablation.

An additional preferred embodiment is distinguished in that a removable covering layer is introduced over the entire substrate after production of the recesses and prior to production of the through holes.

Another advantageous embodiment of the manufacturing process in accordance with the invention distinguishes itself in that the base layer is selectively transformed in the recesses and/or in the through holes into a catalytic and/or activating layer subsequent to its application, preferentially by means of electromagnetic radiation, and in particular using laser radiation.

In a particularly preferred improvement in this embodiment the non-activated base layer is removed in a particularly simple fashion using a chemical wetting solution.

The invention concerns an additional aspect of a method for the production of printed circuit boards having the following steps:

Production of recesses and/or through holes in a substrate made from insulating material, in particular by means of laser-ablation, wherein the recesses and/or through holes correspond to the desired structure of conductive tracks and plated through holes:

introduction of a base layer onto one side or onto both sides of the substrate, the layer being catalytic and/or activating with respect to a conductive material; and introducing a conductive material onto the base layer.

The above mentioned purpose in accordance with the invention is achieved using this method in that a covering layer is brought onto the surface of the base layer subsequent to introduction of the base layer, with the cover layer being subsequently selectively removed from the base layer to produce the recesses.

The above mentioned advantages can also be achieved with this manufacturing process in accordance with the invention.

In a particularly preferred embodiment of this manufacturing procedure, the through holes are formed in the substrate prior to introduction of the covering layer and are covered by the covering layer.

An additional aspect of the invention concerns a manufacturing process for the production of printed circuit boards having the following steps:

Production of recesses and/or through holes in a substrate made from insulating material, in particular by means of laser-ablation, wherein the recesses and/or through holes correspond to the desired structure of conductive tracks and plated through holes;

introduction of a catalytic and/or activating base layer onto one side or onto both sides of the substrate; and introduction of a conductive material onto the base layer.

The above mentioned purpose is achieved in this manufacturing process in accordance with the invention in that the conductive material is introduced onto the surface of the base layer until at least the recesses and/or through holes are completely filled and the conductive material and the base layer are then removed, preferentially by means of etching, until the conductive material is flush with the substrate.

This manufacturing procedure in accordance with the invention has the substantial advantage that the substrate is not mechanically loaded. In addition higher resolution can be achieved, since removal is not effected using abrasive grains, rather is facilitated chemically. The applied conductive material, e.g. copper, can be chemically removed so that same can be recycled and, in contrast to ground-off copper, once more utilized for coating.

In a particularly preferred embodiment of all above mentioned manufacturing processes, a chemical wetting process, physical deposition out of the vapor phase (PVD), or chemical deposition out of the vapor phase (CVD) are utilized to introduce the base layer onto the substrate in a particularly simple manner.

An additional advantageous embodiment of the cited manufacturing process is distinguished in that a metal-oxide compound or an organic palladium compound is utilized as catalytic and/or activating base layer.

An additional aspect of the invention concerns a method for the production of printed circuit boards having the following steps:

Production of recesses and/or through holes in a substrate made from insulating material, in particular by means of laser-ablation, wherein the recesses and/or through holes correspond to the desired structure of conductive tracks and plated through holes; and introduction of a conductive material into the recesses and/or through holes.

The above mentioned purpose is achieved in accordance with this manufacturing process in that irradiation of the recesses and/or through holes with electromagnetic radiation, in particular laser radiation, effects deposition of conductive material in a chemical wetting bath only in the recesses and/or through holes.

The above mentioned advantages can also be achieved with this manufacturing process in accordance with the invention.

In a particularly preferred embodiment of all manufacturing processes, the introduction of the conductive material is effected in a particularly simple fashion using chemical and/or galvanic metal deposition.

An additional advantageous embodiment of all of the above mentioned manufacturing processes is distinguished in that an additional metallic layer is introduced onto the conductive material, preferentially through the galvanic deposition of metal, and is flush with the substrate.

An additional aspect of the invention concerns a method for the production of printed circuit boards having the following steps:

Production of depressions and/or through holes in a substrate made from insulating material, in particular by means of laser ablation, wherein the recesses and/or through holes correspond to the desired structure of conductive tracks and plated through holes.

The above mentioned purpose is realized in this manufacturing process in that conductive material is introduced onto the entire surface of the substrate, preferentially by means of physical or chemical deposition only the vapor phase, until at least the recesses and/or through holes are completely filled and the conductive material is then removed, preferentially by means of etching, until the conductive material is flush with the substrate.

The invention also concerns a conductive track structure having a substrate made from insulating material, having recesses and/or through holes in the substrate, a base layer on the bottom of the recesses and/or on the inner walls of the through holes which is catalytic and/or activating with respect to a conductive material, and a conductive material composite with the surface of the substrate introduced onto the base layer.

A conductive track structure of this kind has also become known in the art through EP 0 677 985 A1.

In accordance with the invention, conductive material is provided for between the inner wall of the recesses and/or through holes and the base layer.

The invention also concerns a conductive track structure having a substrate made from insulating material having recesses and/or through holes provided for in the substrate, with a base layer on the substrate and/or on the inner walls of the through holes which is catalytic and/or activating with respect to a conductive material and having a conductive material introduced onto the base layer.

In accordance with the invention, the conductive material structures formed on the base layer are each insulated from another by means of cover layers formed on the base layer.

Finally, the invention also concerns a conductive track structure having a substrate from insulating material with recesses and/or with through holes provided for in the substrate and having conductive material in the previously produced structures.

In accordance with the invention the conductive material is introduced as a single layer in the previously produced structures.

Further advantages of the invention can be derived from the description and the drawing. The above mentioned features and those to be further described below can be utilized in accordance with the invention individually or collectively in arbitrary combination. The embodiments shown and described are not be considered as exhaustive enumeration, rather have exemplary character for illustration of the invention.

DESCRIPTION OF THE PREFERRED EMBODIMENTS

The substrate 1 of FIGS. 1a through 7f, represents a cross-section through a base material for a highly integrated printed circuit board. Polymer sheets which are resistant to high temperatures are normally utilized as materials for this type of printed circuit boards with polyimide sheets being utilized in the embodiment described. The substrate shown is first attached to a support frame (not shown) for stabilizing the thin foil to provide easier handling for the individual processing steps. After attachment to a support, material is removed from the substrate at the locations corresponding to the subsequent conductive leads 2, 3, 4, 5 in accordance with FIG. 1b. This removal of material effects production of the conductive pattern and is done by means of ablation using a pulsed excimer laser. A through hole 2a is produced in accordance with FIG. 1c by means of additional material removal at the locations corresponding to the subsequent plated through holes likewise using an excimer laser.

A pulsed excimer laser in the UV-region is preferentially utilized for the ablation whose laser beam is structured using a mask corresponding to the desired structure of conductive paths and plated through holes. Alternatively, processing can take place using focussed laser radiation. The motion of the focussed laser beam relative to the substrate can be freely controlled. An adaptive optical system is utilized for steering the laser beam, said system having a plurality of alignable reflecting elements for deflecting various individual beams of the laser directly onto the substrate.

Figure 1A:
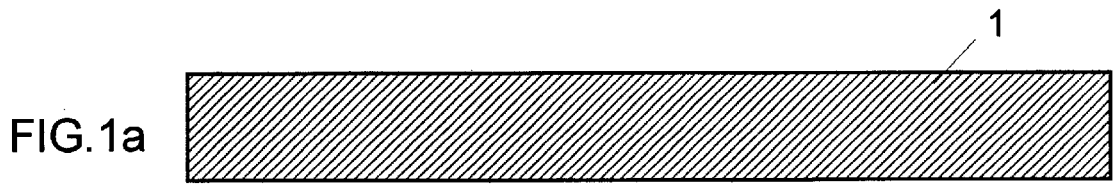
FIG. 1a shows a highly simplified schematic representation of a first step of a first variation for the production of printed circuit boards.
Figure 1B:
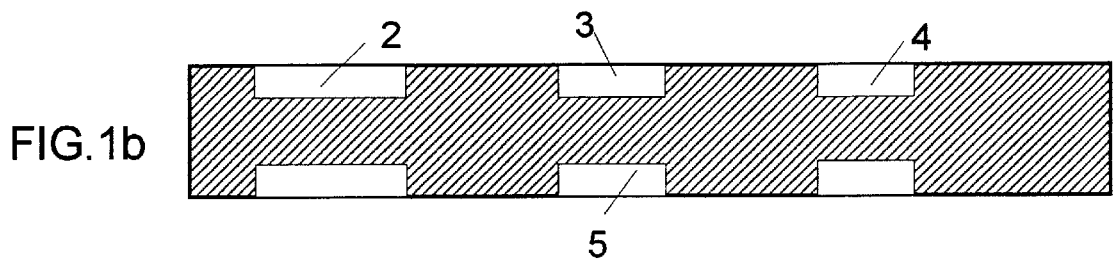
FIG. 1b shows a highly simplified schematic representation of a second step of a first variation for the production of printed circuit boards.
Figure 1C:
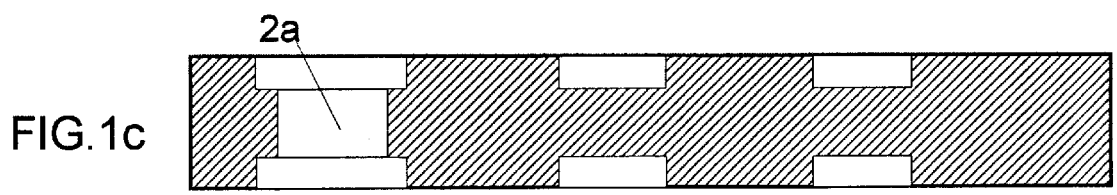
FIG. 1c shows a highly simplified schematic representation of a third step of a first variation for the production of printed circuit boards.
Figure 1D:
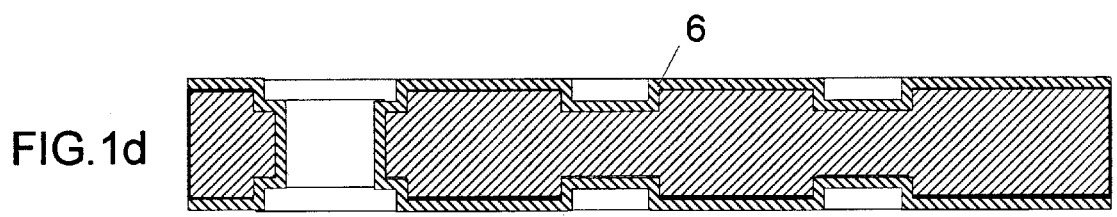
FIG. 1d shows a highly simplified schematic representation of a fourth step of a first variation for the production of printed circuit boards.

A ground layer, indicated in FIG. 1d as thin layer 6, is then introduced following material removal to form the conductive tracks and/or plated through holes. Clearly, the base layer 6 can be introduced onto the surface of the substrate 1 and the walls of the recesses 2, 3, 4, 5 or holes 2a. Conventional wetting processes, PVD/CVD processes or laser-supported deposition methods can be utilized to apply base layer 6.

Figure 1E:
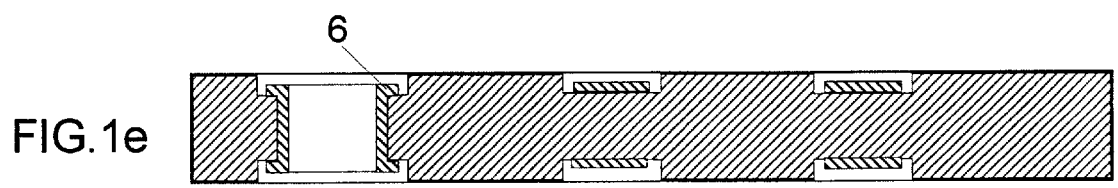
FIG. 1e shows a highly simplified schematic representation of a fifth step of a first variation for the production of printed circuit boards.

After its introduction, the base layer 6 is, in accordance with FIG. 1e, removed from those regions of the substrate 1 which do not correspond to the subsequent conductive tracks and plated through holes. This selective removal of the base layer 6 corresponds to the production of a negative conductive pattern and is effected by means of ablation using a pulsed excimer laser.

Figure 1F:
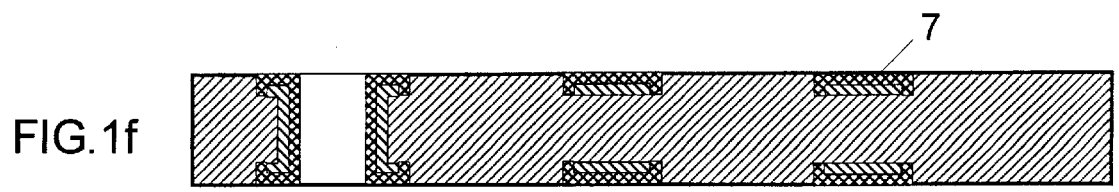
FIG. 1f shows a highly simplified schematic representation of a sixth step of a first variation for the production of printed circuit boards.

Following selective ablation of the base layer 6, a metallic layer 7 is chemically deposited in according with FIG. 1f for subsequent production of the conductive tracks and plated through holes.

Figure 2A:
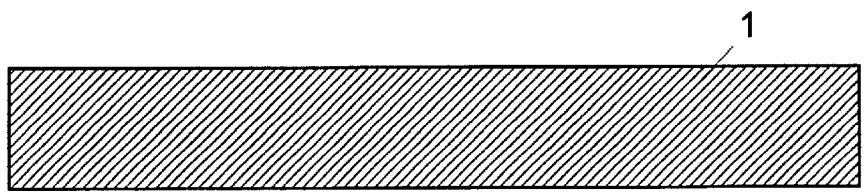
FIG. 2a shows a highly simplified schematic representation of a first step of a second variation for the production of printed circuit boards.
Figure 2B:
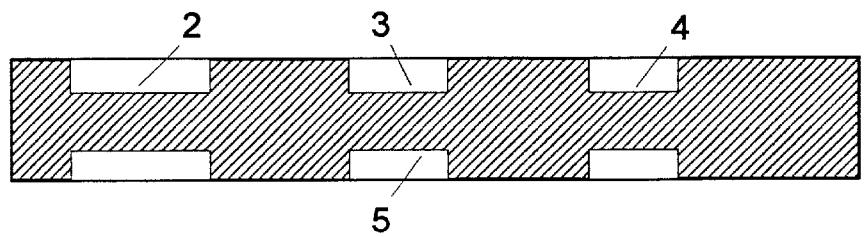
FIG. 2b shows a highly simplified schematic representation of a second step of a second variation for the production of printed circuit boards.
Figure 2C:
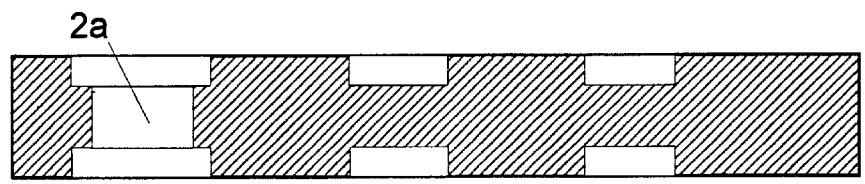
FIG. 2c shows a highly simplified schematic representation of a third step of a second variation for the production of printed circuit boards.
Figure 2D:
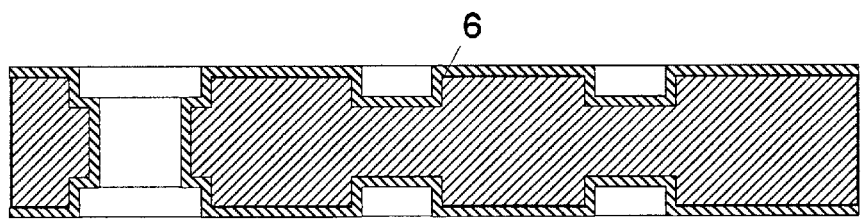
FIG. 2d shows a highly simplified schematic representation of a fourth step of a second variation for the production of printed circuit boards.
Figure 2E:
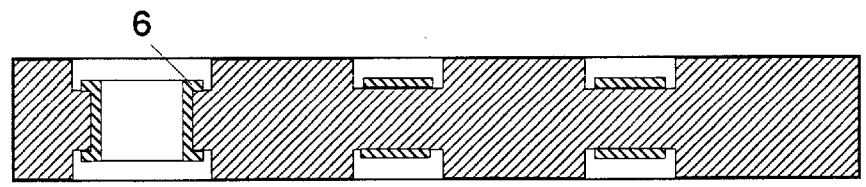
FIG. 2e shows a highly simplified schematic representation of a fifth step of a second variation for the production of printed circuit boards.
Figure 2F:
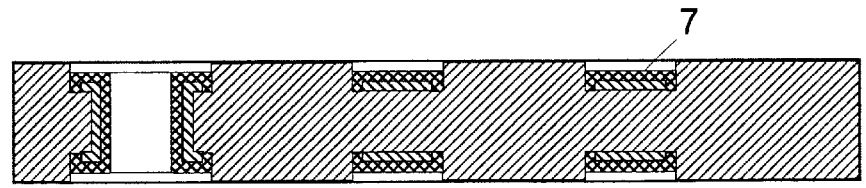
FIG. 2f shows a highly simplified schematic representation of a sixth step of a second variation for the production of printed circuit boards.
Figure 2G:
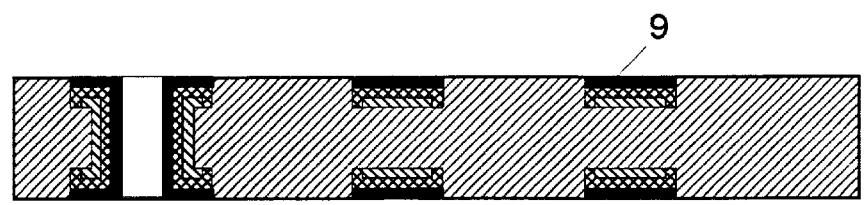
FIG. 2g shows a highly simplified schematic representation of a seventh step of a second variation for the production of printed circuit boards.

In accordance with the variations illustrated with regard to FIGS. 2a through 2g, and in accordance with FIG. 2f, following selective ablation of the base layer 6 a thin metallic layer 7 is chemically deposited in the regions corresponding to the subsequent conductive tracks and plated through holes. Metal 7 is also preferentially currentless deposited copper. In accordance with FIG. 2g, the conductive tracks and the plated through holes are strengthened using a galvanically deposited metal for production of the printed circuit board.

Figure 3A:
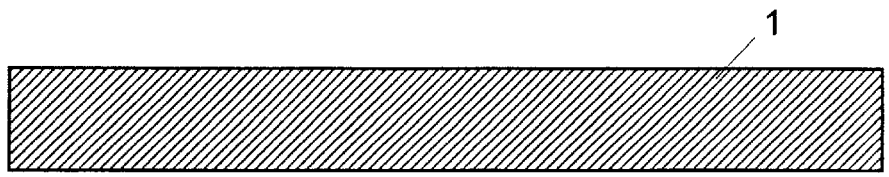
FIG. 3a shows a highly simplified schematic representation of a first step of a third variation for the production of printed circuit boards.
Figure 3B:
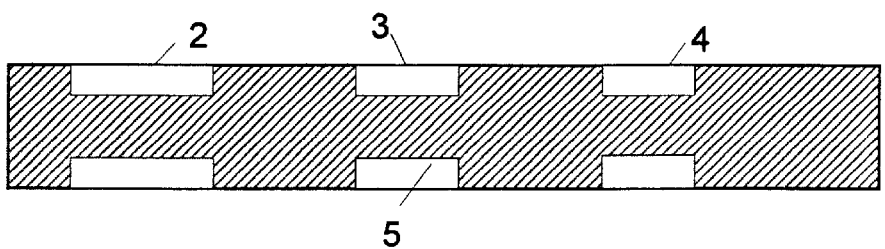
FIG. 3b shows a highly simplified schematic representation of a second step of a third variation for the production of printed circuit boards.
Figure 3C:
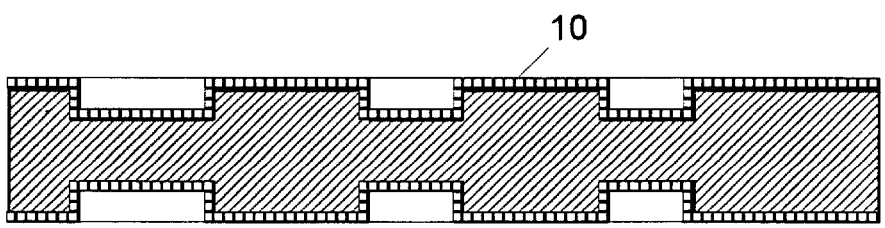
FIG. 3c shows a highly simplified schematic representation of a third step of a third variation for the production of printed circuit boards.
Figure 3D:
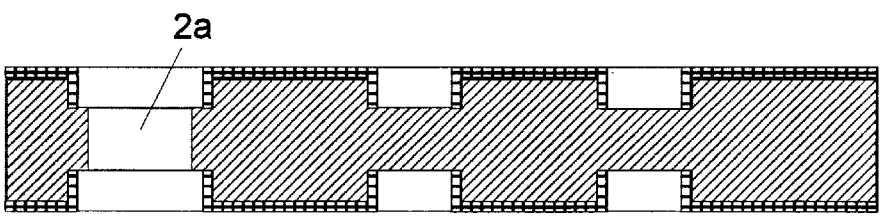
FIG. 3d shows a highly simplified schematic representation of a fourth step of a third variation for the production of printed circuit boards.
Figure 3E:
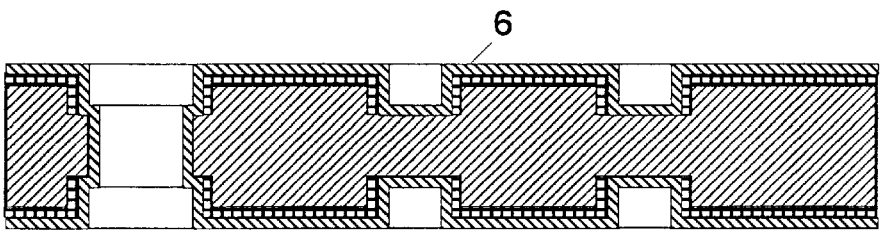
FIG. 3e shows a highly simplified schematic representation of a fifth step of a third variation for the production of printed circuit boards.
Figure 3F:
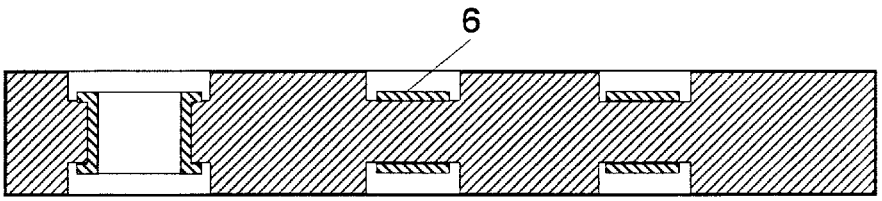
FIG. 3f shows a highly simplified schematic representation of a sixth step of a third variation for the production of printed circuit boards.
Figure 3G:
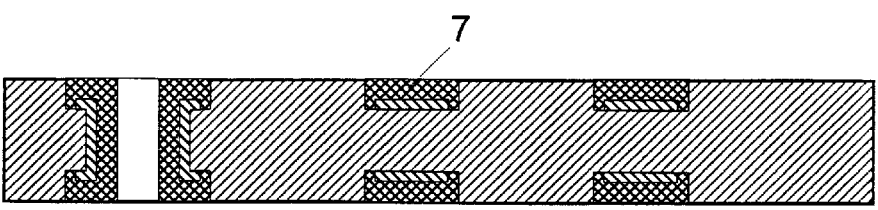
FIG. 3g shows a highly simplified schematic representation of a seventh step of a third variation for the production of printed circuit boards.

In the variations represented in accordance with FIGS. 3a through 3g, a removable cover layer 10 is introduced subsequent to ablation of the regions 2, 3, 4, 5 which correspond to the conductive tracks. Ablation of the substrate material and of the cover layer 10 in the regions 2a corresponding to the through holes and ablation of the cover layer 10 in the regions corresponding to the conductive tracks then takes place. The base layer 6 is first introduced following this step. Clearly, the base layer 6 can be introduced onto the surface of the cover layer, onto the floor of the conductive track structures and onto the walls of the holes in the substrate. Conventional wetting processes, PVD/CVD methods or laser-supported deposition procedures can be utilized for application of this base layer 6. The cover layer 10 can then be removed using a so called lift-off process. As shown in FIG. 3f, the removal of the cover layer 10 coincides with removal of the base layer 6 from the regions outside of the subsequent conductive tracks and plated through holes. In accordance with FIG. 3g, a conductive metallic layer 7 is chemically deposited for production of the subsequent conductive tracks and plated through holes. The lift-off process can be carried out using chemical wetting processes or by means of a mechanical removal procedure.

Figure 4A:
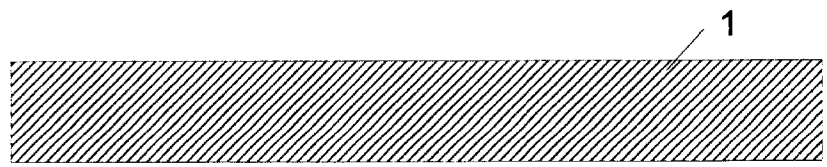
FIG. 4a shows a highly simplified schematic representation of a first step of a fourth variation for the production of printed circuit boards.
Figure 4B:
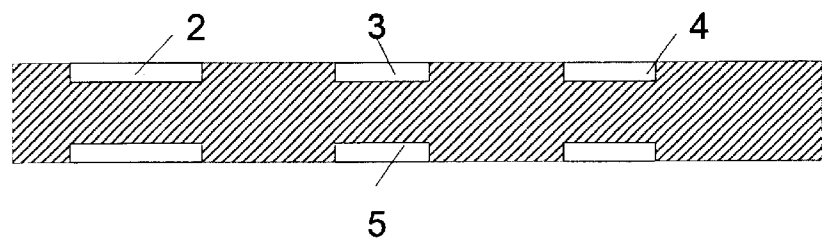
FIG. 4b shows a highly simplified schematic representation of a second step of a fourth variation for the production of printed circuit boards.
Figure 4C:
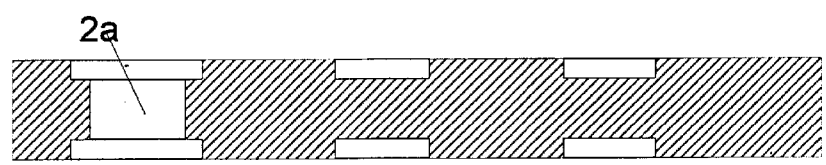
FIG. 4c shows a highly simplified schematic representation of a third step of a fourth variation for the production of printed circuit boards.
Figure 4D:
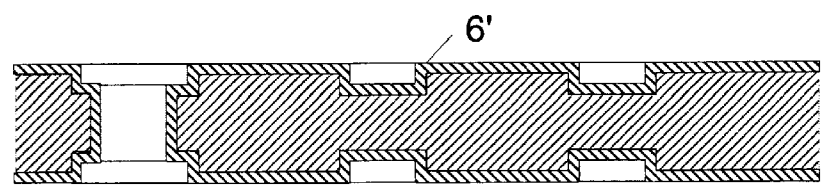
FIG. 4d shows a highly simplified schematic representation of a fourth step of a fourth variation for the production of printed circuit boards.
Figure 4E:
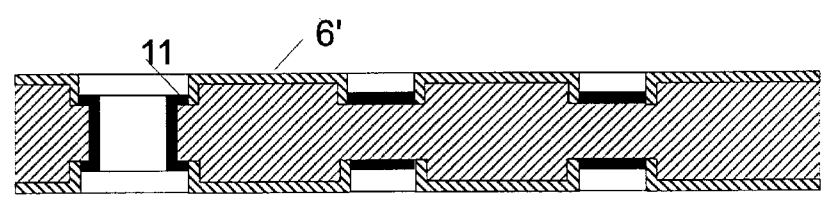
FIG. 4e shows a highly simplified schematic representation of a fifth step of a fourth variation for the production of printed circuit boards.
Figure 4F:
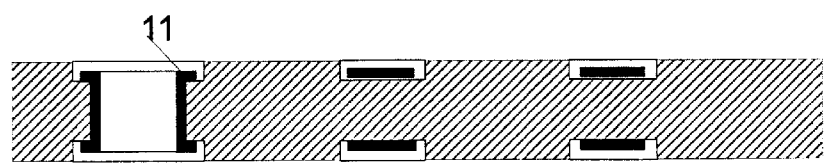
FIG. 4f shows a highly simplified schematic representation of a sixth step of a fourth variation for the production of printed circuit boards.
Figure 4G:
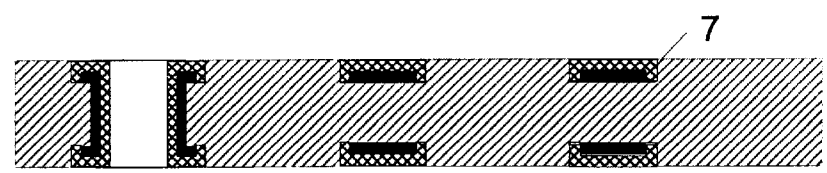
FIG. 4g shows a highly simplified schematic representation of a seventh step of a fourth variation for the production of printed circuit boards.
Figure 5A:
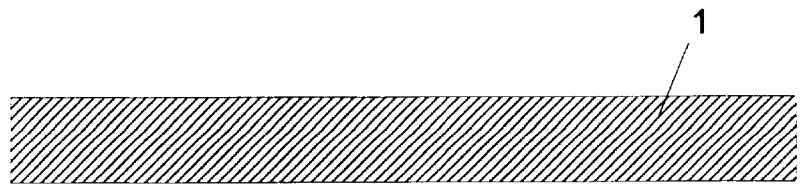
FIG. 5a shows a highly simplified schematic representation of a first step of a fifth variation for the production of printed circuit boards.
Figure 5B:
FIG. 5b shows a highly simplified schematic representation of a second step of a fifth variation for the production of printed circuit boards.
Figure 5C:
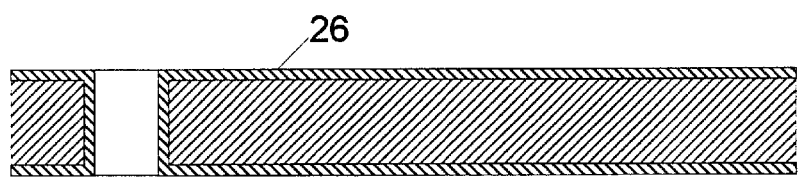
FIG. 5c shows a highly simplified schematic representation of a third step of a fifth variation for the production of printed circuit boards.
Figure 5D:
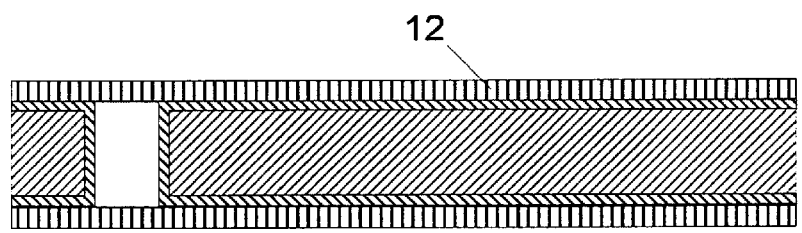
FIG. 5d shows a highly simplified schematic representation of a fourth step of a fifth variation for the production of printed circuit boards.
Figure 5E:
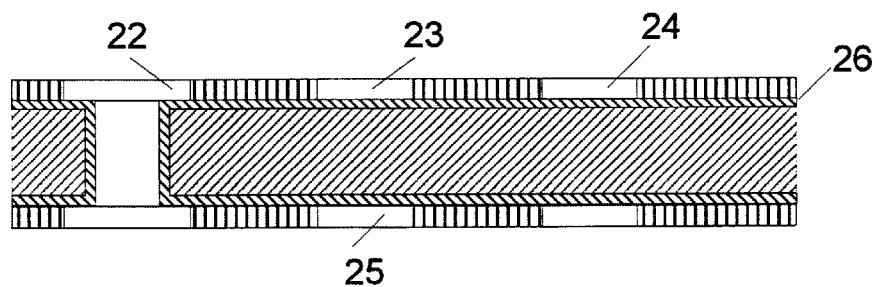
FIG. 5e shows a highly simplified schematic representation of a fifth step of a fifth variation for the production of printed circuit boards.
Figure 5F:
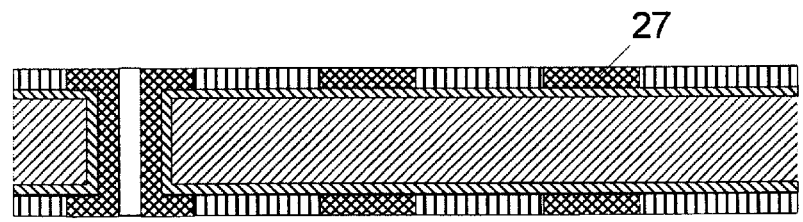
FIG. 5f shows a highly simplified schematic representation of a sixth step of a fifth variation for the production of printed circuit boards.
Figure 6A:
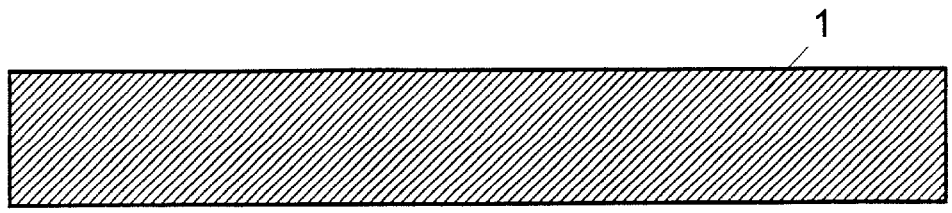
FIG. 6a shows a highly simplified schematic representation of a first step of a sixth variation for the production of printed circuit boards.
Figure 6B:
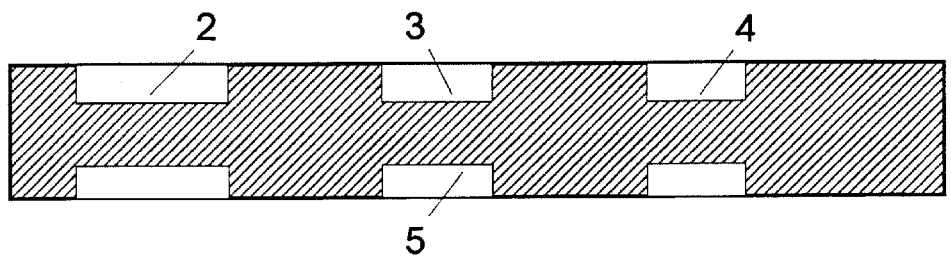
FIG. 6b shows a highly simplified schematic representation of a second step of a sixth variation for the production of printed circuit boards.
Figure 6C:
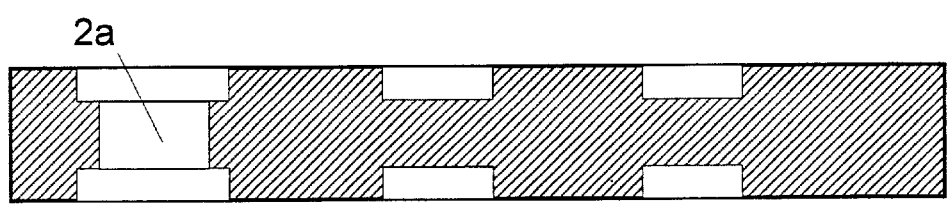
FIG. 6c shows a highly simplified schematic representation of a third step of a sixth variation for the production of printed circuit boards.
Figure 6D:
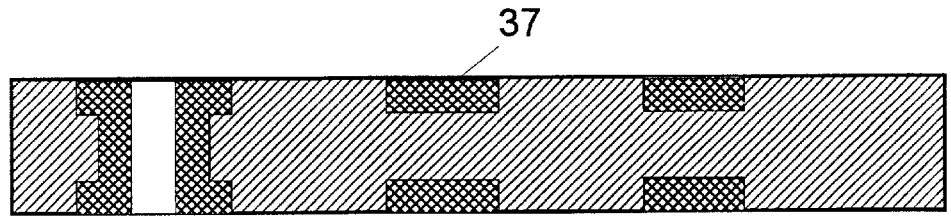
FIG. 6d shows a highly simplified schematic representation of a fourth step of a sixth variation for the production of printed circuit boards.

In the variations shown in FIGS. 4a through 4g, the fully covering base layer 6' is structured in a defined fashion with the assistance of electromagnetic radiation, e.g. with the assistance of laser radiation. Binding seeds 11 are freed in the regions of the subsequent conductive tracks and the plated through holes through the influence of the electromagnetic radiation. The non-irradiated portions of the base layer 6' are, as seen in FIG. 4f, rinsed-off. In accordance with FIG. 4g, a conductive metallic layer 7 is chemically or galvanically deposited for production of the subsequent conductive tracks and plated through holes.

In the variation represented in accordance with FIGS. 5a through 5f, regions of the subsequent plated through holes 22a are initially removed by means of electromagnetic radiation. A base layer 26 is then applied over the entire surface. Conventional wetting processes can be utilized for introduction of the non-conductive base layer 26. A detachable and/or laser-removable cover layer 12 is then applied over the entire surface, likewise using conventional methods. Recesses 22, 23, 24, 25, produced in this cover layer 12 with the assistance of electromagnetic radiation, correspond to the subsequent conductive tracks. The base layer 26 is freed in accordance with FIG. 5e through ablation of the cover layer 12 in these regions. In the subsequent step, conductive material 27 can be selectively deposited in these regions of the subsequent conductive tracks and plated through holes. Alternatively, the conductive track structures can be produced in a photo-sensitive dielectric material through exposure and development.

In the variations represented in FIGS. 6a through 6d, the regions of the subsequent conductive tracks 2, 3, 4, 5 and plated through holes 2a are subjected to electromagnetic radiation. This irradiation causes deposit of conductive material 37 during a chemical wet bath in the regions of the subsequent conductive tracks 2, 3, 4, 5 and plated through holes 2a.

Figure 7A:
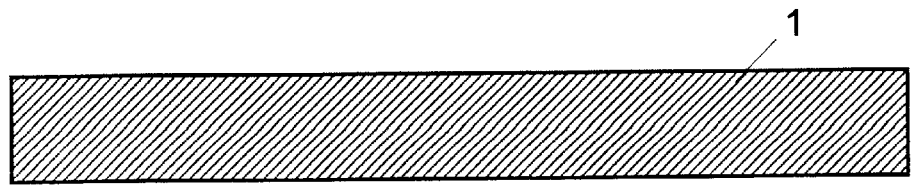
FIG. 7a shows a highly simplified schematic representation of a first step of a seventh variation for the production of printed circuit boards.
Figure 7B:
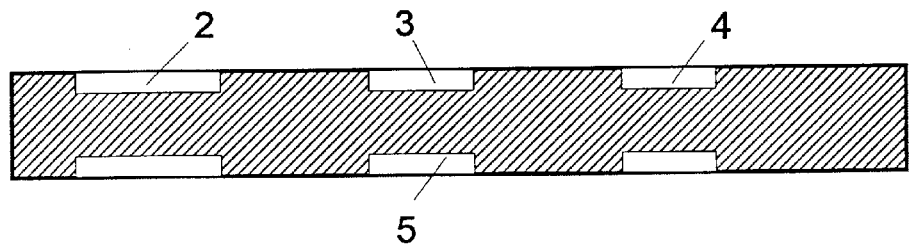
FIG. 7b shows a highly simplified schematic representation of a second step of a seventh variation for the production of printed circuit boards.
Figure 7C:
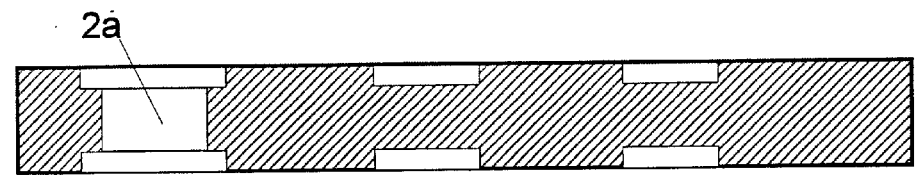
FIG. 7c shows a highly simplified schematic representation of a third step of a seventh variation for the production of printed circuit boards.
Figure 7D:
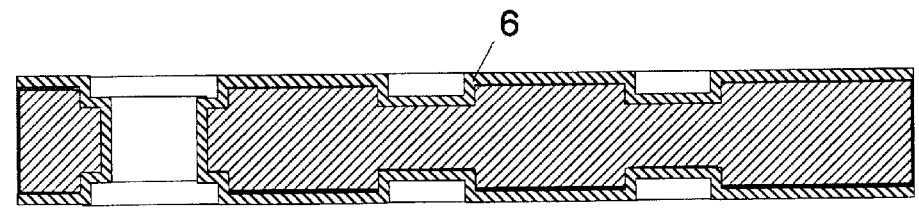
FIG. 7d shows a highly simplified schematic representation of a fourth step of a seventh variation for the production of printed circuit boards.
Figure 7E:
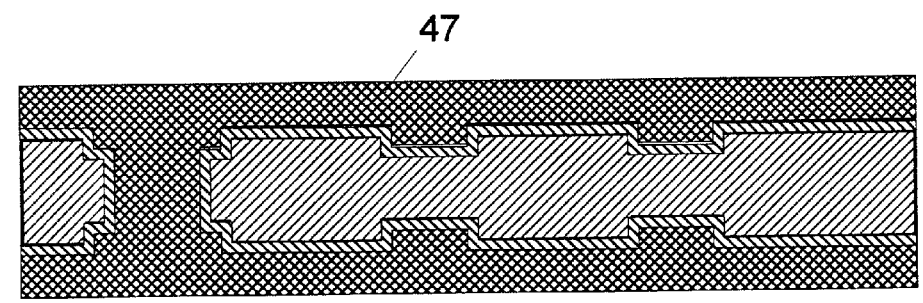
FIG. 7e shows a highly simplified schematic representation of a fifth step of a seventh variation for the production of printed circuit boards.
Figure 7F:
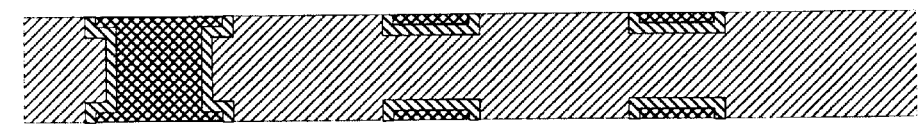
FIG. 7f shows a highly simplified schematic representation of a sixth step of a seventh variation for the production of printed circuit boards.

In the variations represented in FIGS. 7a through 7f, ablation of the base layer 6 in the unnecessary regions is not required after the step shown in FIG. 7d. FIG. 7e shows that conductive material 47 is deposited on the base layer 6 using chemical or galvanic methods until a flat surface is produced. The layer comprising conductive material 47 and the base layer are removed in a subsequent etching process until conductive material 47 only remains in the conductive tracks 2, 3, 4 and 5 and the through hole 2a (FIG. 7f). The conductive material 47 in the recesses 2, 3, 4, 5 is then flush with the surface of the substrate 1.

I claim:

1. A method for the production of printed circuit boards, the method comprising the steps of;
   a) Removing material from a substrate to form a first recess in a first side of said substrate, said first recess having a bottom and a side surface, said first recess side surface defining a first recess width, said first recess for generating a first line of a circuit pattern;
   b) removing material from said substrate to form a second recess in a second side of said substrate, across from and aligned with said first recess, said second recess having a bottom and a side surface, said second recess side surface defining a second recess width, said second recess for generating a second line of a circuit pattern;
   c) removing material from said substrate to form, in one of said first and said second sides, a third recess having a bottom and a side surface, said third recess for generating a third line of a circuit pattern;
   d) removing material from said substrate to produce a through hole centered in and connecting said first recess and said second recess, said through hole having an inner surface defining a width less than said first recess width and less than said second recess width;
   e) covering said first, second and third recess side and bottom surfaces and said through hole inner surface with a base layer;
   f) selectively removing said base layer deposited in step e) from said first, second and third recess side surfaces while leaving said base layer on said first, second, and third recess bottom surfaces and on said through hole inner surface; and
   g) applying a conductive material, following step f), to cover said base layer and to cover said first, second, and third recess side surfaces, wherein said base layer is at least one of catalytic and activating relative to said conductive material.

2. The method of claim 1, wherein step c) comprises forming said third recess in said first side and steps a) and c) are performed prior to step b).

3. The method of claim 1, wherein said base layer is selectively removed by laser-ablation in step f).

4. The method of claim 1, wherein step d) follows step c), the method further comprising the step of:
   c1) applying a removable cover layer to said substrate following step c) and prior to step d).

5. The method of claim 1, further comprising the step of:
   e1) applying electromagnetic radiation to said base layer to convert said base layer into at least one of a catalytic and activating layer.

6. The method of claim 1, wherein a chemical wetting solution is used in step f) to selectively remove said base layer.

7. The method of claim 1, wherein said base layer is introduced onto said substrate in step e) using one of a chemical wetting process, physical vapor phase deposition, and chemical vapor phase deposition.

8. The method of claim 1, wherein said base layer is one of a metal oxide compound and an organic palladium compound.

9. The method of claim 1, wherein said conductive material is applied using one of chemical deposition and galvanic metallic deposition.

10. The method of claim 1, further comprising the step of introducing an additional metallic layer onto said conductive material, said additional layer being flush with said first and said second sides of said substrate.

11. The method of claim 1, further comprising removing said conductive material and said base layer until said conductive material is flush with said first and with said second sides of said substrate.

12. The method of claim 1, further comprising irradiating said first, second and third recesses and said through holes with electromagnetic radiation, and depositing a conductive material using a wet chemical bath.

13. The method of claim 1, wherein step g) comprises applying conductive material to said substrate to completely fill said first, second and third recesses and said through hole, and further comprising removing said conductive material until said conductive material is flush with said first and said second sides of said substrate.

* * * * *